United States Patent
Lu et al.

(10) Patent No.: US 11,112,522 B2
(45) Date of Patent: Sep. 7, 2021

(54) PROXIMITY SENSING SYSTEM WITH COMPONENT COMPATIBILITY TESTING

(71) Applicant: Bently Nevada, LLC, Minden, NV (US)

(72) Inventors: Dan Tho Lu, Minden, NV (US); David Lopez, Minden, NV (US)

(73) Assignee: Bendy Nevada, LLC, Minden, NV (US)

( * ) Notice: Subject to any disclaimer, the term of this patent is extended or adjusted under 35 U.S.C. 154(b) by 117 days.

(21) Appl. No.: 16/684,677

(22) Filed: Nov. 15, 2019

(65) Prior Publication Data

US 2020/0158904 A1    May 21, 2020

Related U.S. Application Data

(60) Provisional application No. 62/768,290, filed on Nov. 16, 2018.

(51) Int. Cl.
  *G01V 3/10*  (2006.01)
  *G01R 35/00*  (2006.01)

(52) U.S. Cl.
  CPC ............ *G01V 3/10* (2013.01); *G01R 35/007* (2013.01)

(58) Field of Classification Search
  CPC .... G01V 3/10; G01R 35/007; G01R 27/2605; G01R 27/26; H03K 17/9502; H03K 2217/952; H03K 2217/94021; H03K 17/97; H03K 17/9537; H03K 17/955; H03K 2217/960725; G01D 5/20; G01D 18/00; G01D 5/24; G01D 5/241; G01D 5/2412; G01D 5/2417; G06K 9/0002; G06F 3/0414; G06F 2203/04103; G01L 1/146
  (Continued)

(56) References Cited

U.S. PATENT DOCUMENTS 2,979,717 A * 4/1961 Shaw ........................ G01S 7/22
                                                    342/426
6,346,807 B1 * 2/2002 Slates .................... G01B 7/003
                                                    324/207.11
(Continued)

*Primary Examiner* — Tung X Nguyen
*Assistant Examiner* — Robert P Alejnikov, Jr.
(74) *Attorney, Agent, or Firm* — Mintz Levin Cohn Ferris Glovsky and Popeo, P.C.

(57) ABSTRACT

Self-testing proximity testing systems and corresponding methods are discussed herein and can include a proximity probe and controller in electrical communication via a cable. A self-testing subsystem can be in communication with the controller and configured to determine whether proximity probes and cables assembled with a controller are compatible or incompatible. The self-testing subsystem can place a known impedance in electrical communication with the controller, modifying a proximity signal output by the controller. When the modified proximity signal differs from a predicted proximity signal by greater than or equal to a threshold amount, the self-testing subsystem can output a first indication indicating that incompatible proximity probes and cables are assembled with a controller. When the modified proximity signal differs from a predicted proximity signal by less than the threshold amount, the self-testing subsystem can output a second indication indicating that compatible proximity probes and cables are assembled with a controller.

22 Claims, 6 Drawing Sheets

(58) Field of Classification Search
USPC ....... 324/601, 457, 519, 548, 600, 602, 609,
324/649, 658, 661, 662, 663, 669, 671,
324/684, 686, 687, 76.11, 76.79, 76.81,
324/123 R, 123 C, 750.17, 109; 702/47,
702/52; 345/174, 173
See application file for complete search history.

(56) References Cited

U.S. PATENT DOCUMENTS

| | | | | |
|---|---|---|---|---|
| 8,159,234 | B2* | 4/2012 | Niwa | H03K 17/954 |
| | | | | 324/686 |
| 8,659,306 | B2* | 2/2014 | Bruwer | G01D 5/241 |
| | | | | 324/684 |
| 9,739,735 | B2* | 8/2017 | Mollov | G01N 27/14 |
| 10,274,526 | B2* | 4/2019 | Reitsma | G01D 5/2006 |
| 10,337,886 | B2* | 7/2019 | Harper | G01R 29/12 |
| 10,488,226 | B2* | 11/2019 | Koizumi | H03K 17/9525 |
| 10,670,643 | B2* | 6/2020 | Sieg | G01R 27/2605 |
| 2006/0056548 | A1* | 3/2006 | Saito | G01D 18/00 |
| | | | | 375/345 |
| 2010/0231239 | A1* | 9/2010 | Tateishi | G01P 15/125 |
| | | | | 324/672 |
| 2015/0015298 | A1* | 1/2015 | Merz | H01L 31/02021 |
| | | | | 324/761.01 |
| 2016/0187277 | A1* | 6/2016 | Potyrailo | G01N 33/2888 |
| | | | | 324/633 |
| 2019/0170547 | A1* | 6/2019 | Morel | G01M 11/319 |
| 2020/0225268 | A1* | 7/2020 | Nagayasu | G01R 27/26 |

* cited by examiner

PROXIMITY SENSING SYSTEM WITH COMPONENT COMPATIBILITY TESTING

CROSS REFERENCE TO RELATED APPLICATIONS

This application claims priority to U.S. Provisional Patent Application No. 62/768,290 filed on Nov. 16, 2018, entitled "Proximity Sensing System with Component Compatibility Testing," which is hereby incorporated by reference in its entirety.

BACKGROUND

In some instances, proximity sensors are a type of sensor that can be used to acquire proximity measurements. Proximity measurements can be employed in a variety of sensing applications, including detecting the presence (proximity) of a target within a defined space and measuring movement (e.g., displacement) of a target. These measurements, alone or in combination with other measurements, can be utilized for feedback control of a target, protection monitoring of a machine containing a target, and/or condition monitoring of a machine containing a target.

There are many types of proximity sensors, and each can be suitable to specific applications and environments. Inductive proximity sensors, also referred to as eddy current proximity sensors, are one type of proximity sensor that can be suitable for use with ferromagnetic targets. In general, an inductive proximity sensor can include a proximity probe that generates an oscillating magnetic field and a controller that is connected to the proximity probe by a cable. The controller outputs a proximity measurement when a portion of the target perturbs this magnetic field. Inductive proximity sensors are non-contacting and can be ruggedized for operation over a wide range of temperatures. Furthermore, inductive proximity sensors can acquire proximity measurements of a target through intervening non-metallic materials, such as plastics and opaque fluids, and can be used in environments that defeat other types of non-contact proximity sensors, such as optical and acoustic-based devices. Thus, inductive proximity sensors can find broad utility in a range of industries such as food and beverage, chemical processing, oil and gas recovery/transportation, pharmaceuticals, and manufacturing, amongst others.

SUMMARY

The controller of an inductive proximity sensor can employ a calibration, also referred to as a scale factor, for generation of proximity measurements. The calibration can be performed for the controller in electrical communication with a predetermined proximity probe having selected characteristics (e.g., material, size, etc.) and a predetermined cable (e.g., selected length). When electrically connected with the controller, the proximity probe and cable form a resonant circuit having electrical properties such as inductance, capacitance, and impedance.

The electrical properties of different proximity probes and cables can vary. As an example, an inductance of the proximity probe can vary with diameter, while a capacitance of the cable can vary with length. In order for the proximity sensor to output accurate proximity measurements, the controller should be assembled with the predetermined proximity probe and cable that for which it has been calibrated.

However, in some circumstances, this matching can be difficult. As an example, the proximity probe, cable, and controller can be decoupled from one another and stored separately when not in use. Subsequently, an operator can assembly the proximity sensor from the proximity probe, cable, and controller in the field. Should one or more of the proximity probe, the cable, and the controller be unlabeled, an operator can assemble a proximity sensor incorrectly, connecting a controller with a proximity probe and/or cable different than those which it was calibrated for use with.

In general, systems and methods are provided for proximity sensors including a self-testing capability to ensure assembly of compatible (calibrated) components.

In an embodiment, a proximity sensing system is provided and it can include a proximity probe, a controller, and a self-testing subsystem. The proximity probe can be configured to generate an oscillating magnetic field in response to receipt of an oscillating current via a cable. The proximity probe and the cable can form a resonant circuit possessing a capacitance $C_1$ in parallel with an inductance $L_1$. The resonant circuit can possess an impedance $Z_1$ that is a function of $C_1$ and $L_1$. The controller can be in electrical communication with the resonant circuit via the cable, and it can be configured to output an initial proximity signal based upon a measured change in the impedance $Z_1$ resulting from perturbation of the generated magnetic field by a ferromagnetic target positioned at a test position with respect to the proximity probe. The self-testing subsystem can be configured to receive the initial proximity signal. The self-testing subsystem can also be configured to place a predetermined self-testing impedance $Z_2$ in parallel with the resonant circuit. The self-testing subsystem can additionally be configured to receive a modified proximity signal, different than the initial proximity signal, output by the controller in response placement of the self-testing impedance $Z_2$ in parallel with the resonant circuit and placement of the target at the test position. The self-testing subsystem can be further configured to receive a reference proximity signal representing the modified proximity signal output by the controller in communication with a predetermined cable and a predetermined proximity probe with the target positioned at the test position. The self-testing subsystem can also be configured to determine a difference between the reference proximity signal and the modified proximity signal. The self-testing subsystem can be further configured to output an incompatibility signal after measuring the difference to be greater than or equal to a threshold amount.

In another embodiment, the threshold amount can be about 5% of the value of the reference proximity signal.

In another embodiment, the self-testing subsystem can be configured to output a compatibility signal, different from the incompatibility signal, after measuring the difference to be less than the threshold amount.

In another embodiment, the test position can be a predetermined gap G separating a sensing surface of the proximity probe from the target.

Embodiments of the initial proximity signal and the modified proximity signal can possess a variety of configurations. In one aspect, the initial proximity signal can include a voltage that varies approximately linearly with a gap G separating a sensing surface of the proximity probe from the target. In another aspect, the initial proximity signal can be a first predetermined voltage value. In a further aspect, the modified proximity signal can be a voltage that differs from the voltage of the initial proximity signal based upon the self-testing impedance $Z_2$.

In another embodiment, the modified proximity signal can be a second predetermined voltage value.

In another embodiment, the self-testing subsystem further can include a switching system. The switching system can be configured to inhibit electrical communication between the controller and the self-testing impedance $Z_2$ during a first time period, where the controller outputs the initial proximity signal during the first time period. The switching system can also be configured to permit electrical communication between the controller and the self-testing impedance $Z_2$ during a second time period, different from the first time period, where the controller outputs the modified proximity signal during the second time period.

In another embodiment, the switching system can include a timer and a switch. The switch can be in electrical communication with the timer, the controller, and the self-testing impedance $Z_2$. The timer can be configured to measure the first time period as a time duration starting from receipt of the oscillating current by the proximity probe. The timer can also be configured to command the switch to adopt an open position that inhibits electrical communication between the controller and the self-testing impedance $Z_2$ during the first time period. The timer can be further configured to measure the second time period as a time duration starting from elapse of the first time period. The timer can be additionally configured to command the switch to adopt a closed position that permits electrical communication between the controller and the self-testing impedance $Z_2$ during the second time period.

In another embodiment, the switching system can be configured to inhibit electrical communication between the controller and the self-testing subsystem during a third time period, immediately following the second time period. The controller can output the initial proximity signal during the third time period.

In another embodiment, the self-testing impedance $Z_2$ can include an inductor of predetermined inductance and a capacitor of predetermined capacitance.

In an embodiment, a method is provided. The method can include generating, by a proximity probe, an oscillating magnetic field in response to receipt of an oscillating current via a cable. The proximity probe and the cable can form a resonant circuit possessing a capacitance $C_1$ an inductance $L_1$, and an impedance $Z_1$ that is a function of $C_1$ and $L_1$. The method can also include outputting, by a controller in communication with the resonant circuit via the cable, an initial proximity signal based upon a measured change in the impedance $Z_1$ resulting from perturbation of the generated magnetic field by a ferromagnetic target positioned at a test position with respect to the proximity probe. The method can additionally include placing, by a self-testing subsystem, a predetermined self-testing impedance $Z_2$ in parallel with the resonant circuit. The method can further include receiving, by the self-testing subsystem from the controller, a modified proximity signal, different than the initial proximity signal, in response to placement of the self-testing impedance $Z_2$ in parallel with the resonant circuit with the target at the test position. The method can additionally include receiving, by the self-testing subsystem, a reference proximity signal representing the modified proximity signal output by the controller in communication with a predetermined cable and a predetermined proximity probe with the target positioned at the test position. The method can also include measuring a difference between the reference proximity signal and the modified proximity signal. The method can additionally include outputting, by the self-testing subsystem, an incompatibility signal after measuring the difference greater than or equal to a threshold amount.

In another embodiment, the threshold amount can be about 5% of the value of the reference proximity signal.

In another embodiment, the method can further include outputting, by the self-testing subsystem, a compatibility signal, different from the incompatibility signal, when the modified proximity signal differs from the reference proximity signal by less than the threshold amount.

Embodiments of the initial proximity signal and the modified proximity signal can have a variety of configurations. In one aspect, the initial proximity signal can include a voltage that varies approximately linearly with distance separating a sensing surface of proximity probe from the target. In another aspect, the initial proximity signal can be a first predetermined voltage value. In a further aspect, the modified proximity signal can be a voltage that differs from the voltage of the initial proximity signal based upon the self-testing inductance $Z_2$.

In another embodiment, the method can include inhibiting, by the self-testing subsystem, electrical communication between the controller and the self-testing impedance $Z_2$ during a first time period, wherein the controller outputs the initial proximity signal during the first time period. The method can further include permitting, by the self-testing subsystem, electrical communication between the controller and the self-testing impedance $Z_2$ during a second time period, different than the first time period, where the controller outputs the modified proximity signal during the second time period.

In another embodiment, the method can include measuring, by a timer, the first time period as a time duration starting from receipt of the oscillating current by the proximity probe. The method can also include adopting, by a switch, an open position during the first time period in response receipt of a first command by the timer, the open position of the switch inhibiting electrical communication between the controller and the self-testing impedance $Z_2$. The method can further include measuring, by the timer, the second time period as a time duration starting from elapse of the first time period. The method can additionally include adopting, by the switch, a closed position during the second time period in response receipt of a second command by the timer, the closed position of the switch permitting electrical communication between the controller and the self-testing impedance $Z_2$.

In another embodiment, the method can include adopting, by the switch, the open position during a third time period response to receipt of a third command by the timer, the third time period occurring immediately following the second time period.

In another embodiment, the self-testing impedance $Z_2$ can include an inductor of predetermined inductance and a capacitor of predetermined capacitance.

BRIEF DESCRIPTION OF THE DRAWINGS

These and other features will be more readily understood from the following detailed description taken in conjunction with the accompanying drawings, in which.

Figure 1:
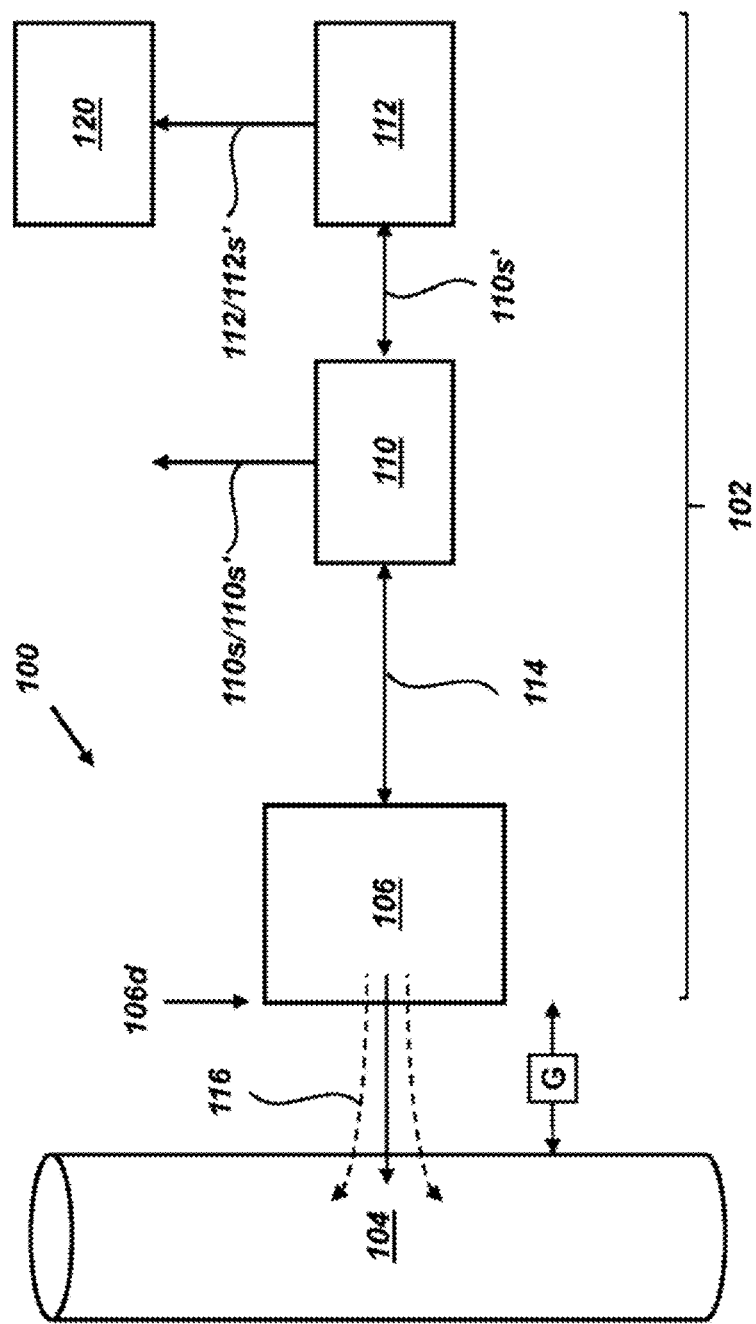
FIG. 1 is a diagram illustrating one exemplary embodiment of an operating environment including a self-testing proximity sensor system including a proximity probe in communication with a controller including a self-testing sub-system via a sensor cable.

It is noted that the drawings are not necessarily to scale. The drawings are intended to depict only typical aspects of the subject matter disclosed herein, and therefore should not be considered as limiting the scope of the disclosure. Those skilled in the art will understand that the systems, devices, and methods specifically described herein and illustrated in the accompanying drawings are non-limiting exemplary embodiments and that the scope of the present invention is defined solely by the claims.

DETAILED DESCRIPTION

Inductive proximity sensors are a type of sensor that employs magnetic fields to acquire proximity measurements. Proximity measurements can provide information regarding the presence of a target object and/or a distance separating the proximity sensor and the target object. As an example, an inductive proximity sensor can include a proximity probe that generates a magnetic field, a controller that outputs proximity measurements based upon changes in the magnetic field resulting from interaction with the target object, and a cable that electrically connects the proximity probe and the controller. Proximity measurements output by the controller can be calibrated by a manufacturer for accuracy based upon a specific combination of proximity probe and cable, referred to as a compatible combination. However, it can be possible to assemble a proximity sensor with a proximity probe and/or cable that differs from the compatible combination and are not calibrated for use with the controller, referred to as an incompatible combination. Use of an incompatible combination of proximity probe and cable can result in output of incorrect proximity measurements by the controller.

Accordingly, improved proximity controllers are discussed below that include a self-testing subsystem that is configured to determine whether a combination of proximity probe and cable assembled with a controller is compatible or incompatible with the controller. As an example, the self-testing subsystem can be configured to modify an initial proximity measurement output by the controller. The value of the modified proximity measurement when a compatible combination of proximity probe and cable are connected to the controller, referred to as a reference proximity signal, can be determined theoretically or experimentally. When an operator assembles a proximity sensor in the field, the modified proximity signal can be compared to the reference proximity signal. When the reference proximity signal and modified proximity signal are relatively close to one another (e.g., less than a threshold amount), the proximity probe and cable combination can be determined to be compatible with the controller, and the controller can output a compatibility indication (e.g., a green light). When the reference proximity signal and modified proximity signal are relatively far from one another (e.g., greater than the threshold amount), the proximity probe and cable combination can be determined to be incompatible with the controller, and the controller can output an incompatibility indication (e.g., a red light). In this manner, an operator can be informed of the compatibility or incompatibility of proximity probes and cables assembled with a controller, ensuring that accurate proximity measurements are acquired.

Embodiments of sensing systems and corresponding methods for testing compatibility of components of a proximity sensing system are discussed herein. However, embodiments of the disclosure can be employed for testing compatibility of other electronic components without limit.

FIG. 1 illustrates one exemplary embodiment of an operating environment 100 containing a self-testing proximity sensor 102 and a target 104. The self-testing proximity sensor 102 can be an eddy current proximity sensor including an eddy current proximity probe 106, a controller 110, and a self-testing subsystem 112. The proximity probe 106 and the controller 110 can be placed in electrical communication via a cable 114. The controller 110 can be configured to generate and transmit an oscillating current to the proximity probe 106 via the cable 114. In response to receipt of the oscillating current, the proximity probe 106 can generate an oscillating magnetic field 116.

In use, the proximity probe 106 can be positioned proximate to the target 104 for acquiring proximity measurements. When the target 104 passes through the generated magnetic field 116, electrical properties of a resonant circuit formed by the cable 114 and the proximity probe 106 can change with a gap G separating the proximity probe 106 (e.g., a distal facing surface 106d) and the target 104. This change can be detected by the controller 110 (e.g., as a change in impedance of the resonant circuit) and, using a predetermined calibration, the controller 110 can generate a proximity signal 110s. As an example, the proximity signal 110s can be a voltage that is inversely proportional to the gap G, increasing as the gap G decreases and decreasing as the gap G increases.

Accuracy of the proximity measurement can rely upon assembly of the self-testing proximity sensor 102 with a proximity probe 106 and cable 114 that are compatible with the controller 110. This accuracy can be achieved by calibrating the controller 110 when assembled (e.g., by a manufacturer or authorized technician) with a predetermined proximity probe and cable. Thus, a compatible combination of proximity probe 106 and cable 114 includes the predetermined proximity probe and cable and can result in accurate measurements of the gap G. In contrast, an incompatible combination of proximity probe 106 and cable 114 does not include at least one of the predetermined proximity probe and cable, and can result in inaccurate measurements of the gap G.

The self-testing subsystem 112 can be configured to determine whether a combination of proximity probe 106 and cable 114 employed with the controller 110 is compatible or incompatible. As discussed in greater detail below, the self-testing subsystem 112 can be configured to selectively place a predetermined self-testing impedance in communication with the resonant circuit formed by the cable 114 and the proximity probe 106, resulting in output a modified proximity signal 110s' by the controller 110. The modified proximity signal 110s' can adopt a known value, referred to herein as a reference proximity signal, when the proximity probe 106 is positioned at a predetermined test position. Under circumstances where the proximity probe 106 and cable 114 are compatible with the controller 110, the modified proximity signal 110s' is approximately equal to the reference proximity signal when the proximity probe 106 is positioned at the test position. In contrast, under circumstances where at least one of the proximity probe 106 and the cable 114 are incompatible with the controller 110, the modified proximity signal 110s' can differ significantly from the reference proximity signal when the proximity probe 106 is positioned at the test position.

The self-testing subsystem 112 can be configured to compare the modified proximity signal 110s' to the reference proximity signal and output at least one notification signal based upon this comparison. As an example, when a magnitude of a difference between the modified proximity signal 110s' and the reference proximity signal is greater than or equal to a threshold amount, the self-testing subsystem 112 can output an incompatibility signal 112s including data representing that at least one of the proximity probe 106 and the cable 114 are incompatible with the controller 110. When a magnitude of the difference between the modified proximity signal 110s' and the reference proximity signal is less than the threshold amount, the self-testing subsystem 112 can output a compatibility signal 112s' including data representing that the proximity probe 106 and the cable 114 are compatible with the controller 110.

In certain embodiments, the incompatibility and compatibility signals 112s, 112s' can be transmitted to a monitoring device 120 for annunciation to an operator. As an example, the monitoring device 120 can be configured to provide an indication (e.g., text, visual perceptible signal, and/or audibly perceptible signal) corresponding to the incompatibility and compatibility signals 112s, 112s'. The monitoring device can be incorporated into the controller or a stand-alone device.

Figure 2:
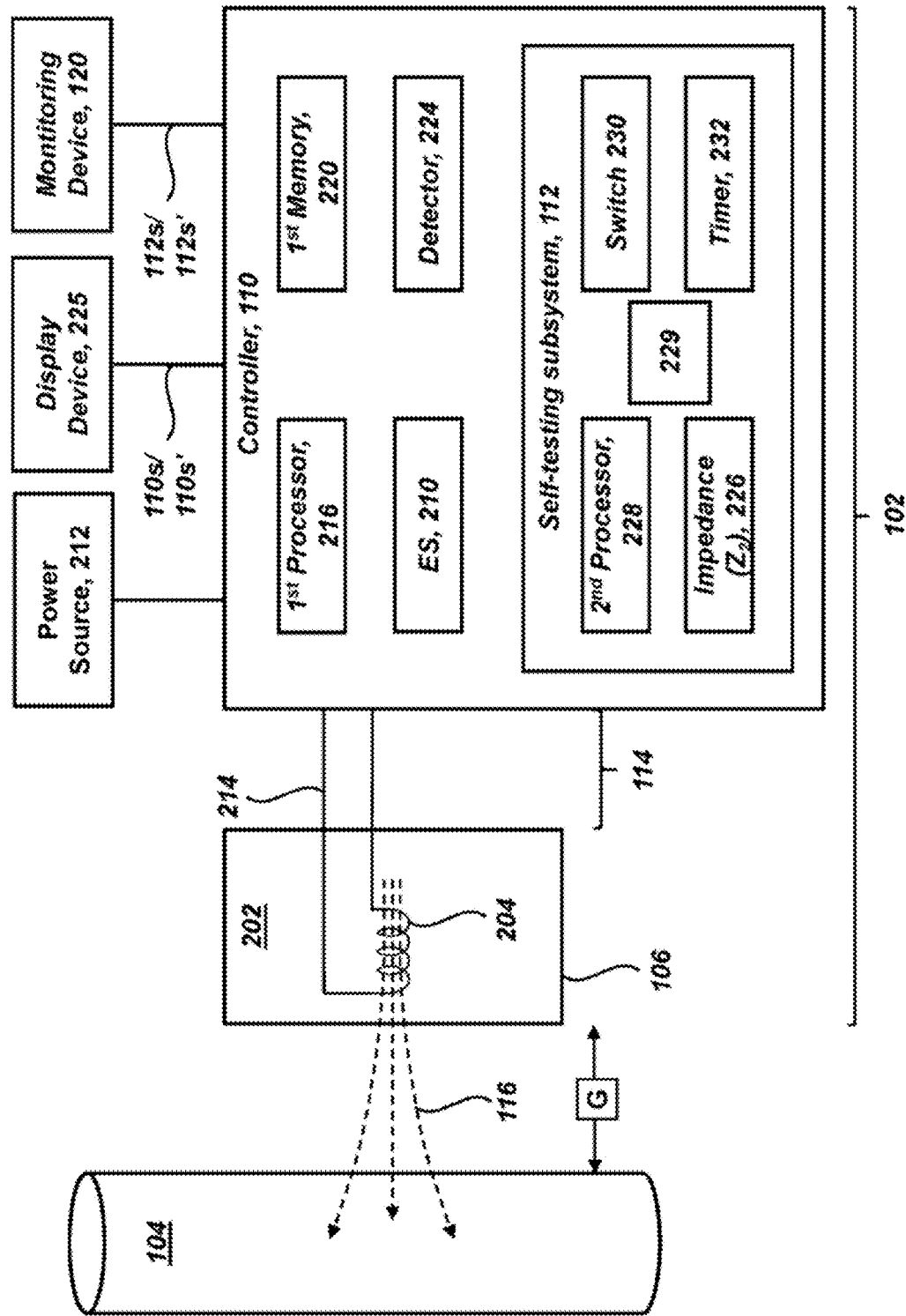
FIG. 2 is a side cross-sectional view of one exemplary embodiment of the self-testing proximity sensor of FIG. 1.

FIG. 2 is a side cross-sectional view of one exemplary embodiment of the self-testing proximity sensor 102 illustrating the proximity probe 106 in electrical communication with the controller 110 via the cable 114. The proximity probe 106 can include a housing 202 that contains a proximity coil 204 (e.g., an electrically conductive wire). As shown in FIG. 2, when the proximity probe 106 is placed in electrical communication with the controller 110 via the cable 114, the proximity coil 204 can be placed in electrical communication with an excitation source ES 210 of the controller 110.

In certain embodiments, as shown, the proximity coil 204 can be an air-core coil that is not wound about a ferromagnetic core. In alterative embodiments, not shown, the proximity coil can be a closed-core coil wound about a ferromagnetic core. The ferromagnetic core can be formed from any ferromagnetic material, such as ferrite.

A power source 212 (e.g., electrical outlets, electrical generators, batteries, etc.) can provide power to the controller 110 and to the excitation source ES 210. The excitation source ES 210 can be configured to generate and transmit an oscillating current 214 to the proximity coil 204. The controller 110 can be configured to control characteristics (e.g., frequency, amplitude, etc.) of the oscillating current 214. The controller 110 can be any computing device employing a general purpose or application specific processor (e.g., first processor 216). In either case, the controller 110 can also include a first memory 220 for storing instructions related to characteristics of the oscillating current 214. The first memory 220 can also include instructions and/or algorithms for employing the self-testing subsystem 112 in combination with the controller for determining whether the proximity probe 106 and the cable 114 are compatible with the controller 110. The first processor 216 can include one or more processing devices, and the first memory 220 can include one or more tangible, non-transitory, machine-readable media collectively storing instructions executable by the first processor 216 to perform the methods and control actions described herein. Embodiments of the controller 110 can be implemented using analog electronic circuitry, digital electronic circuitry, and combinations thereof.

Figure 3:
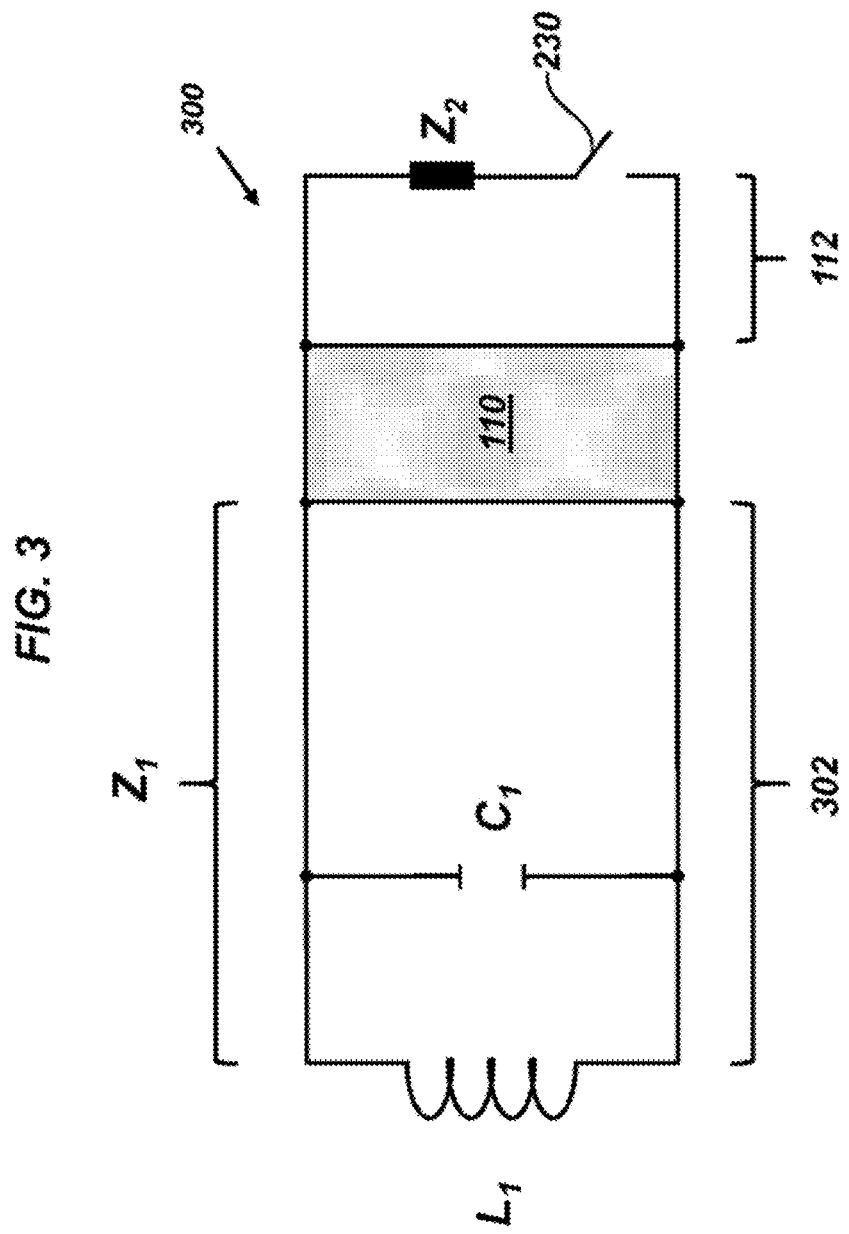
FIG. 3 is a schematic illustration of one exemplary embodiment of a circuit diagram representing the self-testing proximity sensing system of FIG. 1.

FIG. 3 is a diagram illustrating one exemplary embodiment of a circuit 300 representing the self-testing proximity sensor 102. As shown, the proximity coil 204 can be represented as an inductor $L_1$ and the cable 114 can be represented as a capacitor $C_1$ in parallel with the inductor $L_1$. The combination of the inductor $L_1$ and capacitor $C_1$ can form a resonant circuit 302, also referred to as tank circuit. The resonant circuit 302 can also possess an impedance $Z_1$, which is a function of $L_1$ in parallel with $C_1$. The proximity coil 204 can be configured to generate the oscillating magnetic field 116 in response to receipt of the oscillating current 214, causing magnetic flux to permeate the target 104. The target 104 can be any structure formed from a ferromagnetic material (e.g., a machine component or equipment, such as a shaft). Examples of ferromagnetic materials can include iron, steel, cobalt, and alloys thereof.

The generated magnetic field 116 can induce eddy currents (not shown) on the surface of the target 104. These eddy currents can circulate in a direction opposite that of the proximity coil 204, reducing the magnetic flux in the proximity coil 204 and thereby its effective inductance. The eddy currents can also dissipate energy, increasing the resistance of the proximity coil 204. Movement of the target 104 varies the gap G, which changes an inductive coupling between the target 104 and the proximity coil 204. As a result, when gap G increases, the impedance $Z_1$ of the resonant circuit 302 increases. Conversely, when gap G decreases, the impedance $Z_1$ of the resonant circuit 302 decreases.

The controller 110 can include electronic components configured to detect changes in the impedance $Z_1$ of the resonant circuit 302 and output the initial proximity signal 110s based upon these measurements. As an example, the controller 110 can include a detector 224 in electrical communication with the resonant circuit 302 and configured perform one or more signal processing operations to generate the initial proximity signal 110s for output by the controller 110. The detector 224 can be the form of a circuit, an algorithm (e.g., maintained by the first memory 220 and executed by the first processor 216), and combinations thereof for performing signal processing operations. In one aspect, the signal processing operations can include converting measured changes in the impedance $Z_1$ to another electrical parameter, such as an amplitude, phase, or frequency of an RF carrier. In another aspect, signal processing operations can include one or more of demodulation, temperature-compensation, linearization, offsetting, and scaling. The resultant initial proximity signal 110s can be an output (e.g., a current, a voltage, etc.) that is linearly proportional to the gap G.

The initial proximity signal 110s can be output by the controller 110 in a variety of ways. In one aspect, the initial proximity signal 110s can be output to monitoring device 120 in the form of a display device 225. As an example, the display device 225 can display the initial proximity signal 110s as a voltage readout. In another aspect, the initial proximity signal 110s can be output to a data storage device for storage (e.g., a local storage device such as the first memory 220 and/or a remote storage device). The initial proximity signal 110s can be output by wired or wireless connections. As an example, wireless communication devices (not shown), such as radiofrequency (RF) transmitters, can be integrated with the controller 110 to transmit the initial proximity signal 110s.

It can be desirable to employ different proximity probes 106 and cables 114 for different proximity sensing applications. In one aspect, a maximum gap G that can be accurately measured by the proximity probe 106 can be approximately one-half of a diameter of the proximity coil 204. Thus, the proximity probe 106 can be selected such that the diameter of the proximity coil 204 is at least twice (e.g., three times) the dimension of a maximum gap G to be measured by the proximity probe 106. In another aspect, a length of the cable 114 can be dictated by considerations such as placement of the proximity probe 106 with respect to the target 104 and the controller 110. Accordingly, in the field, an operator can desire to match the proximity probe 106 and the cable 114 to a specific controller 110 that is calibrated for the electrical properties of the selected proximity probe 106 and cable 114.

As shown in FIGS. 2-3, the self-testing subsystem 112 can include a predetermined self-testing impedance 226 (referred to herein as $Z_2$) positioned in parallel with the resonant circuit 302, a second processor 228, a second memory 229, a switch 230, and a timer 232. In certain embodiments, the self-testing impedance $Z_2$ can be a combination of a capacitor exhibiting a known capacitance and an inductor exhibiting a known inductance (e.g., imaginary only). In further embodiments, not shown, one or more of the second processor and the timer can be omitted and their respective functionalities can be performed by the first processor. In additional embodiments, one of the first and second memories can be omitted and its functionality can be performed by the other of the second and first memories.

The second memory 229 can include instructions and algorithms executable by the second processor 228, the switch 230, and the timer 232 to test the proximity probe 106 and cable 114 and determine whether they are compatible or incompatible with the controller 110.

The timer 232 can be configured to command the switch 230 to move between an open position and a closed position. In the open position, electrical communication between the self-testing impedance $Z_2$ and the controller 110 can be inhibited and the controller 110 can output the initial proximity signal 110s. In the closed position, electrical communication between the self-testing impedance $Z_2$ and the controller 110 can be permitted and the controller 110 can output the modified proximity signal 110s'.

The modified proximity signal 110s' can be different from the initial proximity signal 110s. As discussed above, the initial proximity signal 110s can depend upon the impedance $Z_1$ of the resonant circuit 302. In contrast, the modified proximity signal 110s' can depend upon the impedance $Z_1$ and the self-testing impedance $Z_2$. When the proximity probe 106 and the cable 114 are compatible with the controller 110, and the proximity probe 106 is positioned at the test position with respect to the target 104, the modified proximity signal 110s' can be approximately equal to the reference proximity signal. That is, a magnitude of the difference between the initial proximity signal 110s and the modified proximity signal can be less than a threshold amount). Notably, the reference proximity signal can be determined empirically and/or theoretically with knowledge of electrical properties of the resonant circuit 302 (e.g., inductance $L_1$ and capacitance $C_1$), the target 104, the gap G (e.g., the test position), and the generated magnetic field 116.

In use, an operator can position the proximity probe 106 at the test position in a variety of ways. In one aspect, the operator can iteratively move the proximity probe 106 and physically measure the gap G in order to achieve the test position. In another aspect, the operator can adjust the position of the proximity probe 106 with respect to the target 104 such that the initial proximity signal adopts a predetermined value.

Figure 4A:
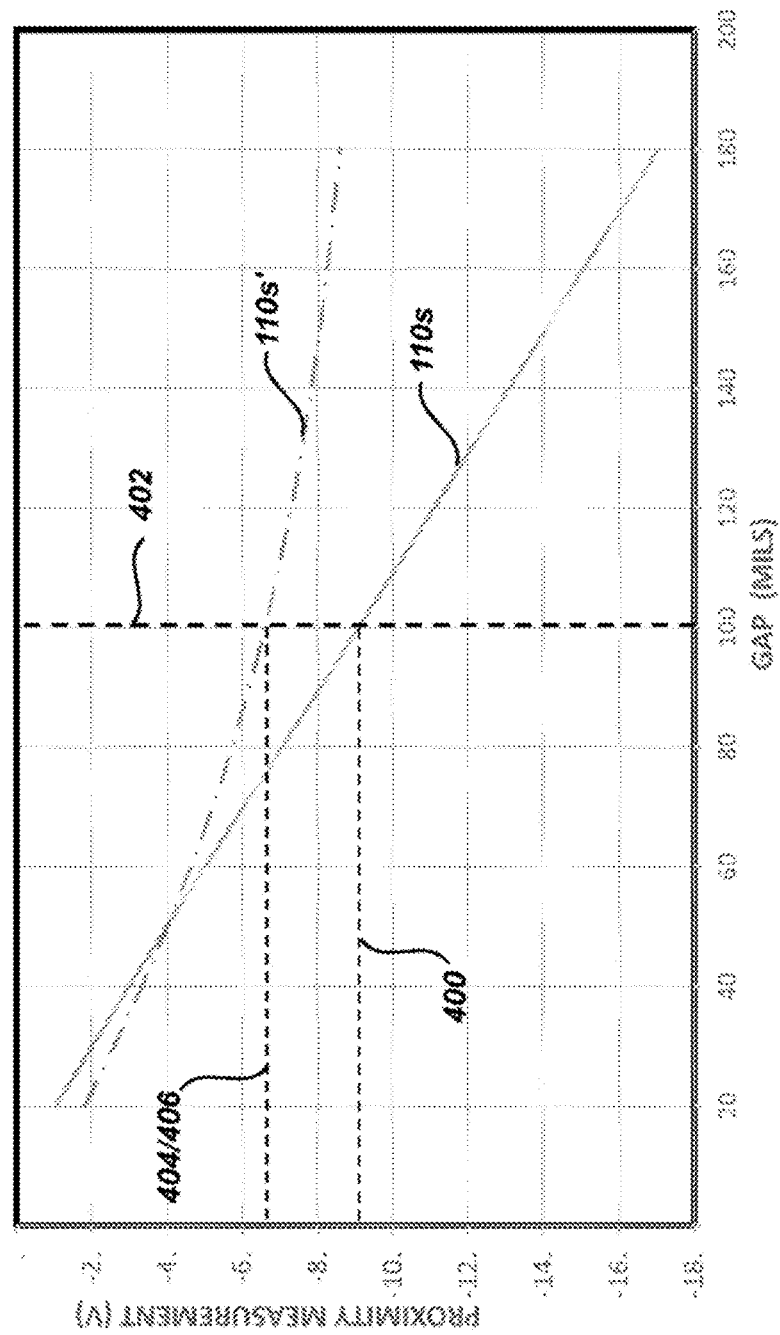
FIG. 4A is a plot illustrating an output of the controller when coupled to a compatible sensor cable and proximity probe, with and without activation of the self-testing subsystem.

FIG. 4A is a plot of the initial proximity signal 110s and the modified proximity signal 110s' as a function of gap G when the proximity probe 106 and the cable 114 are compatible with the controller 110. As shown, an initial value 400 of the initial proximity signal 110s is −9V and the test position 402 corresponds to a predetermined gap G 402 (e.g., approximately 100 mils). Furthermore, the modified proximity signal 110s' adopts a modified value 404 of approximately −6.7V, which is approximately equal to a reference value 406 of the reference proximity signal.

Figure 4B:
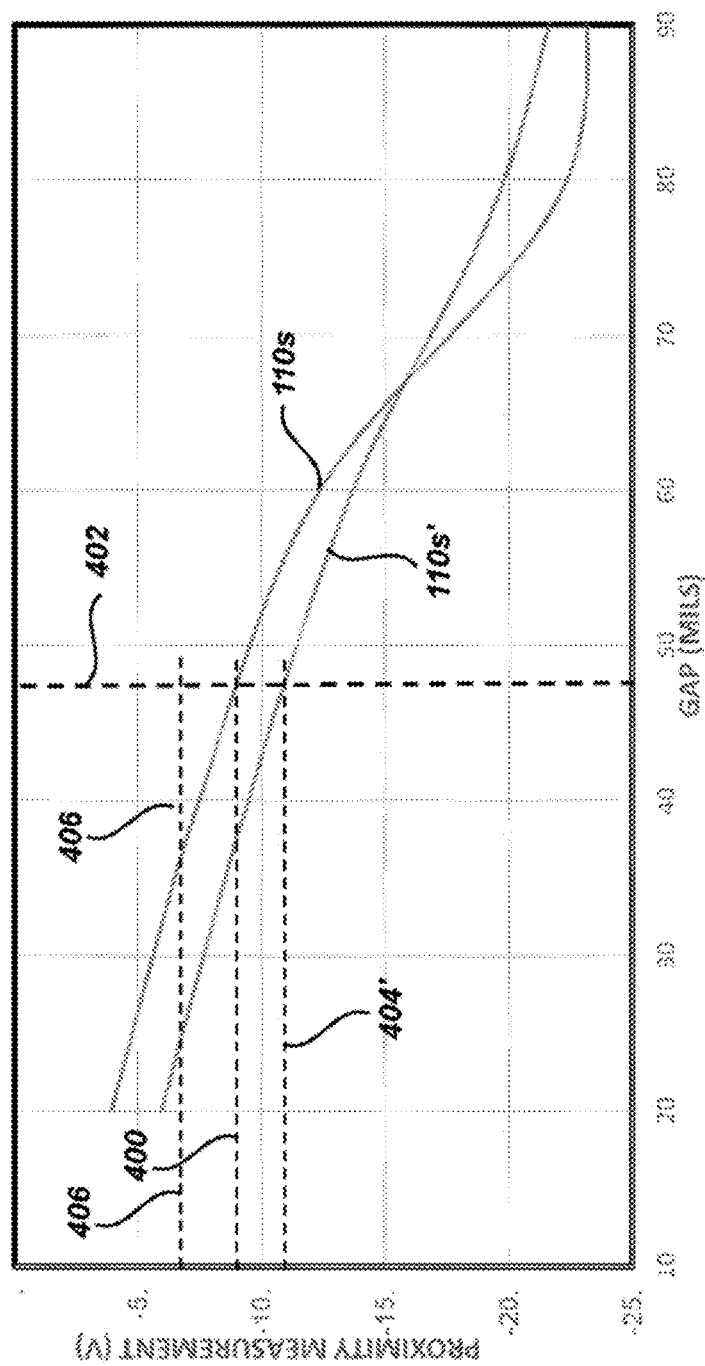
FIG. 4B is a plot illustrating an output of the controller when coupled to a compatible sensor cable and proximity probe, with and without activation of the self-testing subsystem.

FIG. 4B illustrates another plot of the initial proximity signal 110s and the modified proximity signal 110s' as a function of gap G when the proximity probe 106 and/or the cable 114 are not compatible with the controller 110.

As discussed above, while the switch 230 is open, the proximity probe 106 can be positioned at the test position such that the initial value 400 of the initial proximity signal 110s is approximately equal to the predetermined initial proximity signal (e.g., approximately −9V). However, due to incompatibility of the proximity probe 106 and/or the cable 114 with the controller, the test position 402 does not correspond to the predetermined gap G of about 100 mils. Instead, an incorrect gap G of approximately 48 mils is achieved. Furthermore, when the switch 230 is subsequently closed, a modified value 404' of the modified proximity signal 110s' does not adopt the reference value 406 of the reference proximity signal (e.g., −6.7 V). Instead, as shown, the modified value 404' is approximately −11 V, significantly different from the reference proximity signal. Accordingly, the self-testing subsystem 112 (e.g., the second processor 228) can identify the presence of combinations of proximity probes 106 and cables 114 that are compliant and incompliant based upon differences between the modified value 404 of the modified proximity signal 110s' and the reference value 406 of the reference proximity signal.

In one aspect, the self-testing subsystem 112 (e.g., the second memory 229) can maintain the reference value 406 and a predetermined threshold. As an example, the predetermined threshold can have a magnitude selected from the range of about 2% to about 5% of the reference value 406 of the reference proximity signal. The self-testing subsystem 112 (e.g., the second processor 228) can be configured to determine a difference between the reference value 406 and the modified value 404' of the modified proximity signal 110s'. When this difference is greater than or equal to the predetermined threshold, the self-testing subsystem 112 can output the incompatibility signal 112s. In contrast, when this difference is less than the predetermined threshold, the self-testing subsystem 112 can output the compatibility signal 112s'.

The self-testing subsystem 112 can be configured to output the incompatibility and compatibility signals 112s, 112s' to the monitoring device 120, and the monitoring device 120 can be configured to annunciate the incompatibility and compatibility signals 112s, 112s'. Annunciation can include at least one of an audio indication, a visual indication, and combinations thereof. As an example, the monitoring device 120 can display one or more of a first color (e.g., red), a first image, first alphanumeric test (e.g., "Incompatible" or "No pass"), a first sound upon receipt of the incompatibility signal 112s. The monitoring device 120 can further display a second color (e.g., green), a second image, second alphanumeric test (e.g., "Compatible" or "Pass") and/or a second sound upon receipt of the incompatibility signal 112s. In certain embodiments, the functionality of the monitoring device 120 can be incorporated into the display device 225 and/or the self-testing subsystem 112.

Figure 5:
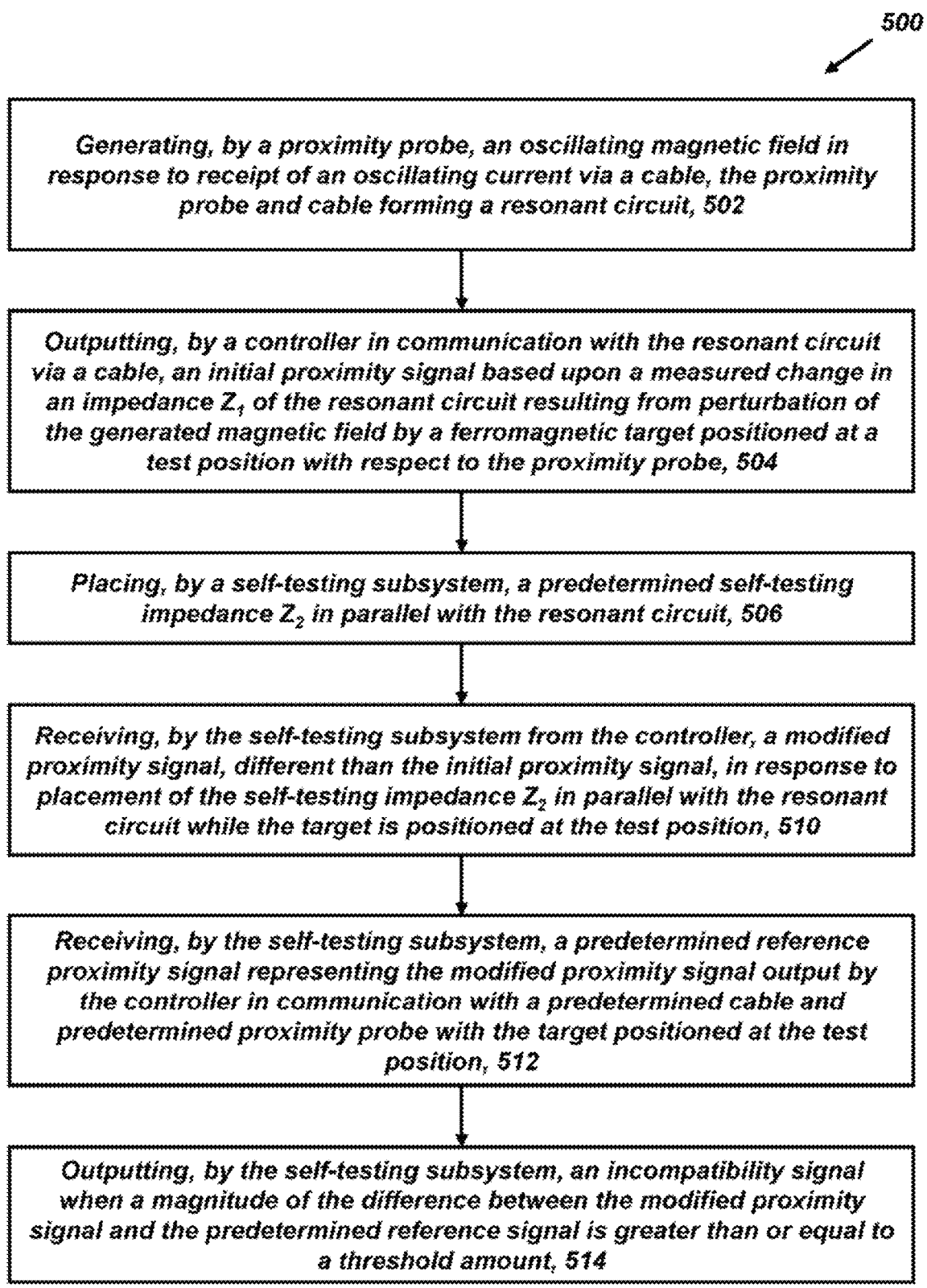
FIG. 5 is a flow diagram illustrating an exemplary embodiment of a method for testing compatibility of a sensor cable and proximity probe with a controller.

FIG. 5 is a flow diagram illustrating one exemplary embodiment of a method 500 for testing compatibility of components of a proximity sensing system. The method 500 is described with reference to the self-testing proximity sensor 102 of FIGS. 1-2 and the circuit 300 of FIG. 3. As shown, the method 500 includes operations 502-514. It can be understood that the method 500 can include greater or fewer operations than illustrated in FIG. 5 and that the operations can be performed in an order different than illustrated.

In operation 502, the oscillating magnetic field 116 is generated. The oscillating magnetic field 116 can be generated by the proximity probe 106 in response to receipt of the oscillating current 214 via the cable 114. The proximity probe 106 and the cable 114 can form the resonant circuit 302 possessing the capacitance $C_1$ and the inductance $L_1$ (and resistance $R_1$, which is very small and can be ignored under most circumstances. $R_1$ (not shown) can be in series with $L_1$ and result in the impedance $Z_1$.

In operation 504, the initial proximity signal 110s can be output by the controller 110. The controller 110 can be in electrical communication with the resonant circuit 302 via the cable 114. The controller 110 can be configured to output the initial proximity signal 110s based upon a measured change in the impedance $Z_1$ of the resonant circuit 302 resulting from perturbation of the generated magnetic field 116 by the ferromagnetic target 104 positioned at the test position with respect to the proximity probe 106. The initial proximity signal can include a voltage that varies approximately linearly with distance separating the distal surface 106d of proximity probe 106 and the target 104.

In operation 506, the self-testing subsystem 112 can receive the initial proximity signal and subsequently place the predetermined self-testing impedance $Z_2$ in electrical communication (e.g., parallel) with the resonant circuit 302. The self-testing impedance $Z_2$ can include an inductor of predetermined inductance and a capacitor of predetermined capacitance.

As an example, the self-testing subsystem 112 can be configured to inhibit electrical communication between the controller 110 and the self-testing impedance $Z_2$ during a first time period. The first time period can be a time duration, measured by the timer 232, starting from receipt of the oscillating current by the proximity probe 106. The switch 230 of the self-testing subsystem 112 can be placed in the open position during the first time period in response to receipt of a command from the timer 232, inhibiting electrical communication between the controller 110 and the self-testing impedance $Z_2$ during the first time period. The controller 110 can output the proximity signal 110s during the first time period.

The switch 230 of the self-testing subsystem 112 can be placed in the closed position during the second time period in response to receipt of a command from the timer 232 to permit electrical communication between the controller 110 and the self-testing impedance $Z_2$. The controller 110 can output the modified proximity signal 110s' during the second time period in response to electrical communication between the controller 110 and the self-testing impedance $Z_2$. The second time period can be a time duration, measured by the timer 232, starting from elapse of the first time period. The modified proximity signal can be a voltage that differs from the voltage of the initial proximity signal 110s based upon the self-testing inductance $Z_2$.

In operation 510, the self-testing subsystem 112 can receive the modified proximity signal 110s'. The modified proximity signal 110s' can be output by the controller 110 in response to placing the self-testing impedance $Z_2$ in parallel with the resonant circuit 302 while the target 104 is positioned at the test position. Accordingly, the modified proximity signal 110s' can be different from the initial proximity signal 110s. In one aspect, the test position can be a predetermined gap G separating the distal surface 106d of the proximity probe 106 and the target 104. In another aspect, the test position can be a position of the target 104 that results in output of a predetermined initial proximity signal.

In operation 512, the self-testing subsystem can receive a predetermined reference proximity signal. The predetermined reference proximity signal can represent the modified proximity signal output by the controller in communication with a predetermined cable and a predetermined proximity probe (e.g., a compatible cable and proximity probe) with the target positioned at the test position.

In operation 514, the self-testing subsystem 112 can output the incompatibility signal 112s when a magnitude of the difference between the modified proximity signal 110s' and the predetermined reference signal is greater than or equal to a threshold amount.

In contrast, the self-testing subsystem 112 can output the compatibility signal 112s' when the magnitude of the difference between the modified proximity signal 110s' and the predetermined reference signal is less than the threshold amount.

Exemplary technical effects of the methods, systems, and devices described herein include, by way of non-limiting example, testing proximity sensing system assembled from proximity probes, cables, and controllers to determine whether the proximity probes and cables are compatible with the controller. The testing can be conducted as a self-test that is performed on power up of the proximity sensing system. By ensuring compatibility of the proximity probes and cables are compatible with the controller, potential mis-tripping and/or false tripping of the machine offline due to mismatching a controller with incompatible proximity probes and/or cables.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Certain exemplary embodiments are described to provide an overview of the principles of the structure, function, manufacture, and use of the systems, devices, and methods disclosed herein. One or more examples of these embodiments are illustrated in the accompanying drawings. The features illustrated or described in connection with one exemplary embodiment can be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:

1. A proximity sensing system, comprising:
a proximity probe configured to generate an oscillating magnetic field in response to receipt of an oscillating current via a cable, the proximity probe and the cable forming a resonant circuit possessing a capacitance $C_1$ in parallel with an inductance $L_1$, wherein the resonant circuit possesses an impedance $Z_1$ that is a function of $C_1$ and $L_1$;
a controller in electrical communication with the resonant circuit via the cable and configured to output an initial proximity signal based upon a measured change in the impedance $Z_1$ resulting from perturbation of the generated magnetic field by a ferromagnetic target positioned at a test position with respect to the proximity probe; and a self-testing subsystem configured to,
  receive the initial proximity signal,
  place a predetermined self-testing impedance $Z_2$ in parallel with the resonant circuit,
  receive a modified proximity signal, different than the initial proximity signal, output by the controller in response to placement of the self-testing impedance $Z_2$ in parallel with the resonant circuit and placement of the ferromagnetic target at the test position,
  receive a reference proximity signal representing the modified proximity signal output by the controller in communication with a predetermined cable and a predetermined proximity probe with the target positioned at the test position,
  determine a difference between the reference proximity signal and the modified proximity signal; and
  output an incompatibility signal after measuring the difference to be greater than or equal to a threshold amount.

2. The proximity sensing system of claim 1, wherein the threshold amount is about 5% of the value of the reference proximity signal.

3. The proximity sensing system of claim 1, wherein the self-testing subsystem is configured to output a compatibility signal, different from the incompatibility signal, after measuring the difference to be less than the threshold amount.

4. The proximity sensing system of claim 1, wherein the test position is a predetermined gap G separating a sensing surface of the proximity probe from the target.

5. The proximity sensing system of claim 1, wherein the initial proximity signal comprises a voltage that varies approximately linearly with a gap G separating a sensing surface of the proximity probe from the target.

6. The proximity sensing system of claim 5, wherein the initial proximity signal is a first predetermined voltage value.

7. The proximity sensing system of claim 6, wherein the modified proximity signal is a voltage that differs from the voltage of the initial proximity signal based upon the self-testing impedance $Z_2$.

8. The proximity sensing system of claim 1, wherein the modified proximity signal is a second predetermined voltage value.

9. The proximity sensing system of claim 1, wherein the self-testing subsystem further comprises a switching system configured to:
  inhibit electrical communication between the controller and the self-testing impedance $Z_2$ during a first time period, wherein the controller outputs the initial proximity signal during the first time period, and
  permit electrical communication between the controller and the self-testing impedance $Z_2$ during a second time period, different from the first time period, wherein the controller outputs the modified proximity signal during the second time period.

10. The proximity sensing system of claim 9, wherein the switching system comprises:
  a timer, and
  a switch in electrical communication with the timer, the controller, and the self-testing impedance $Z_2$;
  wherein the timer is configured to,
    measure the first time period as a time duration starting from receipt of the oscillating current by the proximity probe,
    command the switch to adopt an open position that inhibits electrical communication between the controller and the self-testing impedance $Z_2$ during the first time period,
    measure the second time period as a time duration starting from elapse of the first time period, and
    command the switch to adopt a closed position that permits electrical communication between the controller and the self-testing impedance $Z_2$ during the second time period.

11. The proximity sensing system of claim 10, wherein the switching system is configured to inhibit electrical communication between the controller and the self-testing subsystem during a third time period, immediately following the second time period, wherein the controller outputs the initial proximity signal during the third time period.

12. The proximity sensing system of claim 1, wherein the self-testing impedance $Z_2$ comprises an inductor of predetermined inductance and a capacitor of predetermined capacitance.

13. A method, comprising:
  generating, by a proximity probe, an oscillating magnetic field in response to receipt of an oscillating current via a cable, wherein the proximity probe and the cable form a resonant circuit possessing a capacitance $C_1$ an inductance $L_1$, and an impedance $Z_1$ that is a function of $C_1$ and $L_1$;
  outputting, by a controller in communication with the resonant circuit via the cable, an initial proximity signal based upon a measured change in the impedance $Z_1$ resulting from perturbation of the generated magnetic field by a ferromagnetic target positioned at a test position with respect to the proximity probe;
  placing, by a self-testing subsystem, a predetermined self-testing impedance $Z_2$ in parallel with the resonant circuit;
  receiving, by the self-testing subsystem from the controller, a modified proximity signal, different than the initial proximity signal, in response to placement of the self-testing impedance $Z_2$ in parallel with the resonant circuit with the target at the test position;
  receiving, by the self-testing subsystem, a reference proximity signal representing the modified proximity signal output by the controller in communication with a predetermined cable and a predetermined proximity probe with the target positioned at the test position; and
  measuring a difference between the reference proximity signal and the modified proximity signal; and
  outputting, by the self-testing subsystem, an incompatibility signal after measuring the difference greater than or equal to a threshold amount.

14. The method of claim 13, wherein the threshold amount is about 5% of the value of the reference proximity signal.

15. The method of claim 13, comprising outputting, by the self-testing subsystem, a compatibility signal, different from the incompatibility signal, when the modified proximity signal differs from the reference proximity signal by less than the threshold amount.

16. The method of claim 13, wherein the initial proximity signal comprises a voltage that varies approximately linearly with distance separating a sensing surface of proximity probe from the target.

17. The method of claim 16, wherein the initial proximity signal is a first predetermined voltage value.

18. The resonant circuit of claim 17, wherein the modified proximity signal is a voltage that differs from the voltage of the initial proximity signal based upon the self-testing inductance $Z_2$.

19. The method of claim 13, comprising:
inhibiting, by the self-testing subsystem, electrical communication between the controller and the self-testing impedance $Z_2$ during a first time period, wherein the controller outputs the initial proximity signal during the first time period, and
permitting, by the self-testing subsystem, electrical communication between the controller and the self-testing impedance $Z_2$ during a second time period, different than the first time period, wherein the controller outputs the modified proximity signal during the second time period.

20. The method of claim 19, comprising:
measuring, by a timer, the first time period as a time duration starting from receipt of the oscillating current by the proximity probe;
adopting, by a switch, an open position during the first time period in response receipt of a first command by the timer, the open position of the switch inhibiting electrical communication between the controller and the self-testing impedance $Z_2$;
measuring, by the timer, the second time period as a time duration starting from elapse of the first time period; and
adopting, by the switch, a closed position during the second time period in response receipt of a second command by the timer, the closed position of the switch permitting electrical communication between the controller and the self-testing impedance $Z_2$.

21. The method of claim 20, comprising adopting, by the switch, the open position during a third time period response to receipt of a third command by the timer, the third time period occurring immediately following the second time period.

22. The method of claim 13, wherein the self-testing impedance $Z_2$ comprises an inductor of predetermined inductance and a capacitor of predetermined capacitance.

* * * * *